(12) United States Patent
Hsu

(10) Patent No.: US 6,930,569 B2
(45) Date of Patent: Aug. 16, 2005

(54) MICROMECHANICAL RESONATOR HAVING SHORT SUPPORT BEAMS

(75) Inventor: Wan-Thai Hsu, Ann Arbor, MI (US)

(73) Assignee: Discera, San Jose, CA (US)

( * ) Notice: Subject to any disclaimer, the term of this patent is extended or adjusted under 35 U.S.C. 154(b) by 28 days.

(21) Appl. No.: 10/632,165

(22) Filed: Jul. 31, 2003

(65) Prior Publication Data

US 2005/0024165 A1 Feb. 3, 2005

(51) Int. Cl.$^7$ .......................... H03N 9/00; H02N 2/00; H01L 41/04; H01L 41/08; H01L 41/18
(52) U.S. Cl. ............................ 333/186; 310/348
(58) Field of Search .................. 333/186, 33, 134, 333/198, 187, 189; 257/536; 324/322; 438/795; 310/309, 320, 348

(56) References Cited

U.S. PATENT DOCUMENTS

| | | | | |
|---|---|---|---|---|
| 3,142,027 A | * | 7/1964 | Albsmeier et al. | 333/198 |
| 4,342,969 A | * | 8/1982 | Myers et al. | 333/33 |
| 4,382,238 A | * | 5/1983 | Makimoto et al. | 333/134 |
| 5,260,658 A | * | 11/1993 | Greim et al. | 324/322 |
| 5,976,994 A | * | 11/1999 | Nguyen et al. | 438/795 |
| 6,169,321 B1 | * | 1/2001 | Nguyen et al. | 257/536 |
| 6,249,073 B1 | | 6/2001 | Nguyen | |

OTHER PUBLICATIONS

W. –T. Hsu, J.R. Clark, and C.T. –C. Nguyen, Q–optimized lateral free–free beam micromechanical resonators, Digest of Technical Papers, Jun. 10–14, 2001 11th Int. Conf. on Solid–State . . . Sensors & Actuators (Transducers' 01), Munich, Germany.

K. Wang, Y. Yu, A. –C. Wong and C.T. –C.Nguyen, VHF free–free beam high–Q micromechanical resonators, Technical Digest, Jan. 17–21, 1999, 12th International IEEE Electro Mechanical Systems Conf Orlando, Florida.

C.T. –C. Nguyen, Transceiver front–end architectures using vibrating micromechanical signal processors (invited), Dig. of Papers. Sep. 12–14, 2001 Topical Meeting on Silicon Monolithic Integrated Circuits in RF Systems.

C.T. –C. Nguyen, Frequency–selective MEMS for miniaturized low–power communication devices (invited), IEEE Trans. Microwave Theory Tech Aug. 1999. vol. 47. No. 8.

* cited by examiner

*Primary Examiner*—Patrick Wamsley
(74) *Attorney, Agent, or Firm*—DeMont & Breyer, LLC

(57) ABSTRACT

The illustrative embodiment of the present invention is a vertical-mode, free-free beam resonator, and micromechanical circuits that include one or more such resonators. In accordance with the illustrative embodiment, the resonator comprises a movable beam that overlies a drive electrode. The movable beam is supported by a plurality of supports, the length of which is substantially less than one-quarter of a wavelength of the resonant frequency of the resonator.

22 Claims, 6 Drawing Sheets

MICROMECHANICAL RESONATOR HAVING SHORT SUPPORT BEAMS

FIELD OF THE INVENTION

The present invention relates to micromechanical resonators.

BACKGROUND OF THE DISCLOSURE

A substantial portion of the circuit-board space of conventional radios (e.g., in cellular phones, etc.) is occupied by off-chip components (e.g., inductors, capacitors, etc.). If all of the components of the radio could be incorporated onto a single chip, the resulting radio would be substantially smaller and more energy efficient than existing radios. To this end, investigators are studying how to create a "single-chip" radio.

Some proposed architectures for the single-chip radio (and interim architectures) include subsystems that incorporate micro-electromechanical systems ("MEMS") technology. Examples of radio subsystems or "micromechanical circuits" that incorporate MEMS are switches (e.g., for transmit/receive selection; antenna selection, etc.), RF and IF filters, signal processors, and tunable oscillators. The MEMS devices that are used in these subsystems function as "circuit elements," and include MEMS resonators, inductors and capacitors. The branch of MEMS technology pertaining to devices for RF applications, such as the single-chip radio, is referred to as "RF MEMS."

Many of the more useful micromechanical circuits for RF communications are those that include high-Q resonators and microwave and millimeter-wave high-Q filters. As is well known, the "Q" or "quality factor" of a resonator or filter is a measure of its selectivity (among other accepted definitions).

Possessing a "high" Q is important in oscillators because adequate short- and long-term stability of oscillation frequency is assured only when the Q of the frequency-setting tank circuit exceeds a certain threshold. The ability to implement very selective IF and RF filters is also dependent upon high tank Q. See, e.g., Nguyen et al., "Frequency-Selective MEMS for Miniaturized Low-Power Communication Device," *IEEE Trans. Microwave Theory Tech.*, v(47), no.8, pp. 1486–1503 (August 1999).

MEMS-based resonators have been demonstrated at HF (3 MHz to 30 MHz), VHF (about 30 MHz to 300 MHz) and even UHF (300 MHz to 3 GHz). The challenge is to maintain an acceptably-high Q at these frequencies. Three types of prior-art MEMS resonators, which are capable of operating at HF or higher frequencies, are discussed below (see FIGS. 1 through 3).

FIG. 1 depicts "clamped-clamped beam" resonator 100, which consists of movable beam 102 and stationary drive electrode 108. Beam 102, which is electrically conductive, is anchored or "clamped" to underlying ground plane/sense electrode 106 at anchors 104. Electrode 108 is disposed beneath beam 102. The beam and electrode are separated by gap 110.

Resonator 100 accepts two electrical inputs, $v_i$ and $v_p$. Electrical input $v_p$ is a DC-bias voltage that is applied to beam 102 via ground plane 106. This bias voltage generates an electrostatic force that statically bends or flexes beam 102 downward toward electrode 108, reducing the size of gap 110. It is typically necessary to reduce the size of gap 110 in this fashion since gap 110 is too large as formed to provide adequate electromagnetic coupling for most situations.

Electrical input $v_i$ is an ac excitation signal that is applied to electrode 108. The frequency of electrical input $v_i$ is swept, and, in response to certain frequencies, beam 102 vibrates. A current, $i_o$, is generated by the vibration of beam 102. This current, which is the output of resonator 100, is detected directly off the DC-biased ground plane/sense electrode 106.

A clamped-clamped resonator having a quality factor of about 8000 at 8.5 MHz resonant frequency (HF) has been demonstrated. See, e.g., Nguyen et al., "Transceiver Front-End Architectures Using Vibrating Micromechanical Signal Processors," cited above.

Clamped-clamped resonators can be designed for resonant frequencies as high as the UHF range, as a function of material (e.g., polycrystalline silicone, diamond, etc.), vibration mode, and resonator beam dimensions. Furthermore, clamped-clamped resonators are readily fabricated with high stiffness, which is advantageous, because the stiffness of the resonator is proportional to the dynamic range of circuits that include these resonators.

But the utility of clamped-clamped resonators is limited. This limitation pertains not to operating frequency, but rather to an inability to maintain a suitably high quality factor as operating (resonant) frequency increases. In particular, due to the relatively high stiffness of most clamped-clamped resonator designs, a substantial portion of internal energy is dissipated through anchors 104 as the resonant frequency approaches the VHF range.

One solution to this problem is to further miniaturize the dimensions of a clamped-clamped resonator from micron-scale down to submicron or nano-scale. At these smaller dimensions, stiffness can be limited to smaller values to reduce energy loss (to the substrate) through the anchors. But this approach disadvantageously sacrifices power-handling capability or dynamic range, so that it might prove to be unworkable in certain situations, such as for communications applications in which co-site interference is a problem.

To retain a sufficiently high quality factor at VHF frequencies without sacrificing power-handling capability, a "free-free beam" resonator design was developed. FIG. 2 depicts an example of vertical-mode, free-free resonator 200.

Free-free resonator 200 includes movable beam 202 and stationary drive electrode 208. Beam 202, which is electrically conductive, is supported at its flexural nodal points 201 by four torsional-mode supports 203. The remote end (from beam 202) of each support 203 is anchored or "clamped" to underlying ground plane/sense electrode 206 at anchors 204. Electrode 208 is disposed beneath beam 202. Electrode 208 and beam 202 are separated by gap 210. Beam 202 is biased and excited to resonance in the same fashion as beam 102.

Supports 203 have a length that is one-quarter wavelength of the operating (resonant) frequency of resonator 200. This "quarter-wave" length causes an impedance transformation that advantageously isolates beam 202 from anchors 204. In other words, beam 202 ideally experiences zero mechanical impedance into its supports 203, effectively operating as if it were levitated without any supports. As such, the energy-dissipation mechanisms prevailing in clamped-clamped resonators like resonator 100 are substantially suppressed. Consequently, for a similarly-dimensioned resonant structure (i.e., the beam), free-free resonator 200 can attain a relatively higher Q than clamped-clamped resonator 100 at higher frequencies. See, e.g., U.S. Pat. No. 6,249,073; Wang et al., "VHF Free-Free Beam High-Q Micromechanical Resonators," *Technical Dig., Int'l IEEE Micro Electro Mechanical Systems Conf.*, Orlando, Fla., pp. 453–458 (Jan. 17–21, 1999). And since it is not necessary to reduce the size of beam 202 to address stiffness considerations (as for clamped-clamped resonator 100), free-free resonator 200 provides adequate dynamic range and power-handling capabilities.

Free-free resonators have been demonstrated at frequencies between 30–90 MHz (VHF) with a substantially constant Q that exceeds 8000. See, e.g., U.S. Pat. No. 6,249,073; and Wang et al., "VHF Free-Free Beam High-Q Micromechanical Resonators," cited above.

While free-free resonator 200 advantageously provides high Q at high frequency, it does have some drawbacks. Some of the key drawbacks of this resonator are related to its vertical mode (i.e., "up and down") of operation. In particular, as a vertical-mode resonator, free-free resonator 200 exhibits:

Topography-induced frequency uncertainty.

Lower Q due to larger energy dissipation through anchors 204.

Fabrication complexity issues that often constrain vertical mode resonators to be one-port devices, effectively eliminating opportunities for balanced or differential-mode operation.

Geometric inflexibility imposed by vertical-mode operation.

The relatively long length of quarter-wave supports 203 is the cause of another drawback of (vertical-mode) resonator 200. Specifically, due to the relatively long length of quarter-wave supports 203, resonator 200 is susceptible to "pull-in" or "pull-down." Pull-down is a phenomenon whereby the resonant structure (i.e., beam 202) is pulled into contact with an underlying structure (i.e., electrode 208) due to the applied DC-bias voltage. This contact prevents the resonant structure from vibrating. In the case of quarter-wave supports 203, the application of even a small DC-bias voltage, as is required across between beam 202 and electrode 208 to reduce gap 210 to an acceptably-small size, might cause pull-in.

To address the drawbacks of the vertical-mode resonator, a lateral-mode, free-free beam resonator was developed. See, e.g., Hsu et al., "Q-Optimized Lateral Free-Free Beam Micromechanical Resonators," *Dig. of Tech. Papers*, 11th *Int'l, Conf. on Solid State Sensors & Actuators (Transducers '01)*, Munich, Germany, pp. 1110–1113 (Jun. 10–14, 2001).

FIG. 3 depicts lateral-mode, free-free resonator 300. As depicted in FIG. 3, resonator 300 includes movable beam 302 and flanking stationary electrodes 308A and 308B. Electrode 308A is a drive electrode (i.e., causes beam 302 to vibrate) and electrode 308B is a sense electrode (i.e., senses vibration of beam 302). Each electrode 308 is separated from beam 302 by gap 310. Beam 302, which is electrically conductive, is supported at its nodal points 301 by four lateral-flexural-mode supports 303. The remote end (from beam 302) of each support 303 is anchored or "clamped" to underlying ground plane/sense electrode 306 at anchors 304.

Lateral-mode resonator 300 avoids some of the drawbacks of a vertical-mode resonator, as discussed above. The relatively long length of quarter-wave supports 303 does not render lateral-mode resonator 300 susceptible to pull-in since, under applied DC-bias, the direction of movement of beam 302 is horizontal, not vertical.

To investigate the degree of isolation provided by (second-mode) supports 303, the length of supports 303 was varied. Variations from the optimal length of supports 303 (quarter-wave) resulted in a drop in Q (e.g., to about 7000 for a decrease in the length of supports 303 from 25.4 microns to 5.6 microns and to about 4000 for an increase in the length of supports 303 from 25.4 microns to about 31 microns).

It is apparent, then, that each resonator described above has drawbacks that limit its utility. A need remains, therefore, for an improved resonator design.

SUMMARY OF THE DISCLOSURE

The illustrative embodiment of the present invention is a vertical-mode, free-free beam resonator, and micromechanical circuits that include one or more such resonators.

In resonators and micromechanical circuits in accordance with the illustrative embodiment, the length of each support (which supports the resonating element) is substantially less than one-quarter of a wavelength of the resonant frequency of the resonator. This is in contrast to prior-art, vertical-mode, free-free beam resonators, wherein the length of each support is a full one-quarter of a wavelength of the resonant frequency of the resonator.

It has been found, unexpectedly, that the quality factor, Q, of vertical-mode, free-free beam resonators in accordance with the illustrative embodiment degrades relatively little as the supports are reduced in length from the usual (quarter-wavelength) length. As a consequence of this reduction in length, resonators and micromechanical circuits in accordance with the illustrative embodiment avoid at least some of the drawbacks of the prior art.

In particular, free-free beam resonators in accordance with the illustrative embodiment are far less susceptible to pull-in or pull down (of the beam to the underlying electrode) than vertical-mode, free-free beam resonators in the prior art. This is a direct result of the substantially shorter supports of the present resonators.

In addition to a decreased likelihood of pull-in, this reduction in the size of the supports provides a number of other benefits, including, without limitation:

an increase in resonant frequency;

no penalty in power handling capabilities; and a decrease in vacuum requirements.

Regarding the increase in resonant frequency, the decrease in the length of the support contributes mechanical stiffness to the movable beam. By way of example, for a beam having the dimensions 40 microns×8 microns×2 microns (length×width×thickness), the resonant frequency increases by about 60 percent (10.4 MHz to 16 MHz) when reducing the length of a quarter-wave support (about 96 microns) down to about 2 microns.

Since the resonant frequency can be increased without decreasing the size of the beam, power-handling capabilities and dynamic range will not be compromised, as it is for clamped-clamped beam resonators.

Furthermore, by virtue of its structure, a resonator in accordance with the illustrative embodiment of the present invention can be operated at higher pressure (although still under partial vacuum) than prior-art, clamped-clamped resonators.

In some embodiments, a resonator in accordance with the illustrative embodiment is capable of passively (no additional power consumption) compensating for temperature-induced or generally-induced (e.g., aging, acceleration, etc.) shifts in resonant frequency. This provides temperature stability, such as is needed for reference oscillator applications in portable wireless communications and for RF channel-select filter banks.

Compensation is implemented, in some embodiments, using an electrode that overhangs the movable beam of the resonator. The temperature response of the overhanging electrode causes the gap between the overhanging electrode and the beam to increase with increasing temperature. This results in a decrease in the electrical stiffness of the resonator, and a concomitant increase in resonant frequency.

In some embodiments, this frequency-increase response offsets and cancels the decrease in frequency normally caused by the dependence of Young's modulus on temperature. In some other embodiments, wherein the thermal response of the resonator must satisfy a given profile, rather than be nulled, the overhanging electrode is designed to provide the desired resonance-frequency response with changes in temperature.

These and other variations of the illustrative embodiment of the present invention are depicted in the Drawings and described further below in the Detailed Description.

DETAILED DESCRIPTION

The following references provide information that can be used in the design and fabrication of the illustrative embodiments of the present invention. Each of these references is incorporated herein in their entirety:

U.S. Pat. Nos. 6,249,073 B1, 6,169,321, and 5,976,994.

Publ. U.S. Pat. Apps. US 2002/0070816 A1 and US 2003/0051550 A1.

Nguyen et al., "Micromachined Devices for Wireless Telecommunications," *Proc. IEEE*, v.(86), no.8, pp. 1756–1768 (August 1998).

Wang et al., "VHF Free-Free Beam High-Q Micromechanical Resonators," *Technical Dig., Int'l IEEE Micro Electro Mechanical Systems Conf.*, Orlando, Fla., pp. 453–458 (Jan. 17–21, 1999).

Nguyen et al., "Frequency-Selective MEMS for Miniaturized Low-Power Communication Device," *IEEE Trans. Microwave Theory Tech.*, v(47), no.8, pp. 1486–1503 (August 1999).

Bannon et al., "High Frequency Micromechanical Filters," *IEEE J. Solid-State Cir.*, v(35), n. 4, pp. 512–526 (April 2000).

Nguyen et al., "Transceiver Front-End Architectures Using Vibrating Micromechanical Signal Processors," *Dig. Of Papers, Topical Mtg on Silicon Monolithic Integrated Circuits in RF Systems*, pp. 23–32 (Sep. 12–14, 2001).

Nguyen, "Vibrating RF MEMS for Low Power Wireless Communications," *Proc. 2000 Int'l. MEMS Workshop (iMEMS '01)*, Singapore, pp. 21–34 (July 2001).

Figure 1:
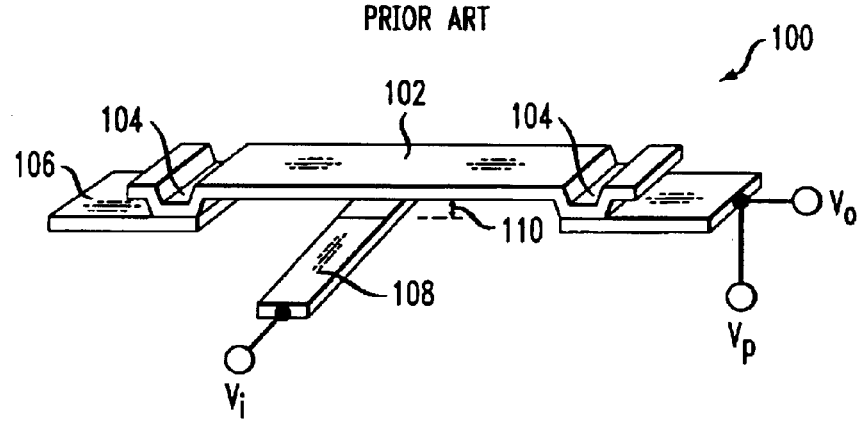
FIG. 1 depicts a first example of a prior-art micro-mechanical resonator.
Figure 2:
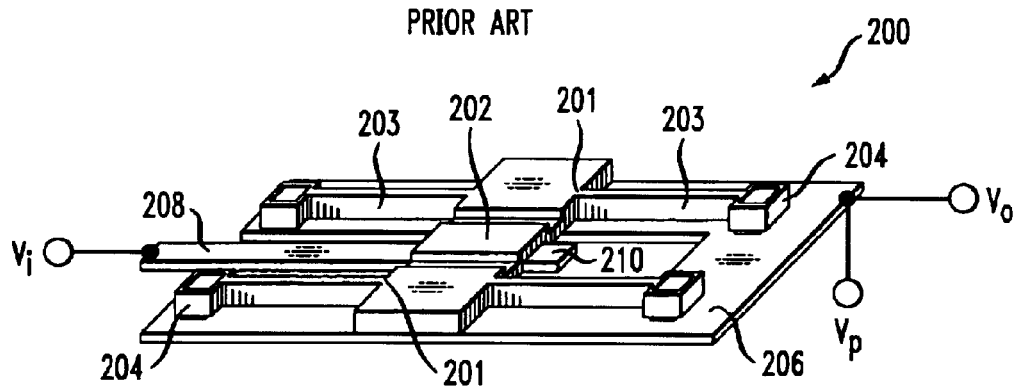
FIG. 2 depicts a second example of a prior-art micro-mechanical resonator.
Figure 3:
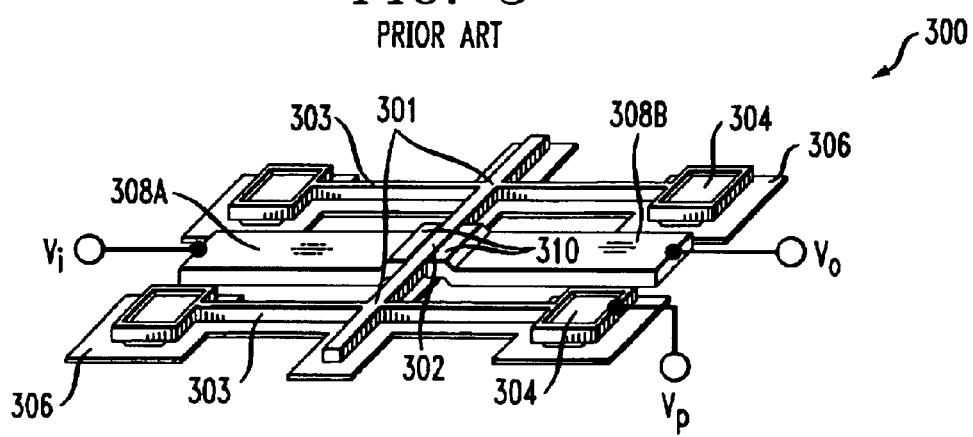
FIG. 3 depicts a third example of a prior-art micro-mechanical resonator.
Figure 4:
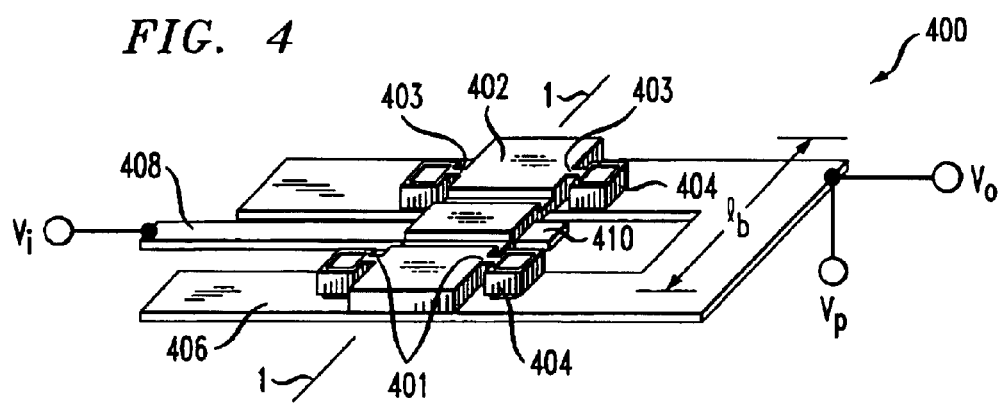
FIG. 4 depicts a perspective view of a micro-mechanical resonator in accordance with the illustrative embodiment of the present invention.
Figure 5:
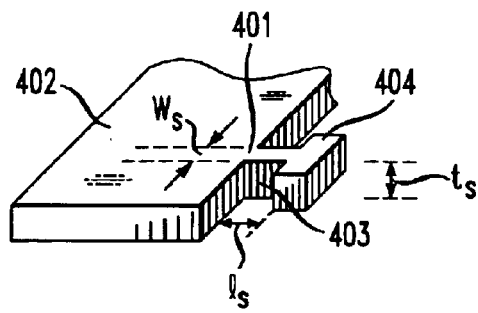
FIG. 5 depicts further detail of a short support of the micro-mechanical resonator of FIG. 4.
Figure 6:
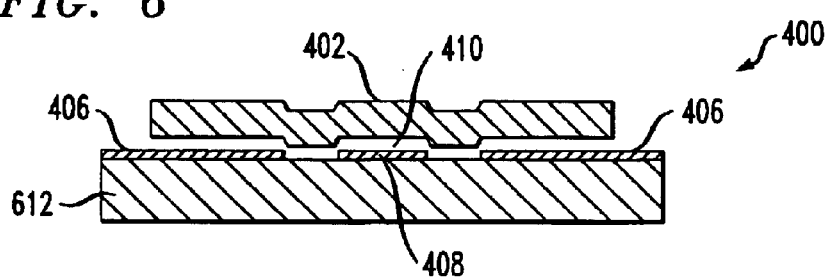
FIG. 6 depicts a cross-sectional view of the micro-mechanical resonator depicted in FIG. 4 along axis 1—1.

FIGS. 4 through 6 depict vertical mode, free-free beam resonator 400 in accordance with the illustrative embodiment of the present invention.

Like resonator 200, resonator 400 includes movable beam 402 and drive electrode 408. Beam 402 is electrically conductive, and is advantageously formed of a silicon material, such as polysilicon. Other suitable materials include, without limitation, polydiamond, or plated metals.

Establishing the resonant frequency of beam 402 is, of course, of major importance in the design of resonator 400. A variety of parameters affect the resonant frequency of beam 402, including, for example, its dimensions, stiffness, mass, and beam topography, among others. As a practical matter, the length, $l_b$, of beam 402 is an important determinant of resonant frequency. For cases in which the length, $l_b$, of beam 402 is large relative to the width and thickness of beam 402, the Euler-Bernoulli equation for the fundamental-mode frequency of a free-free beam provides acceptable results. For higher-frequency designs, where the length of beam 402 approaches its width and thickness dimension, a different design procedure (by Timoshenko) is recommended. For the design of free-free beams, such as beam 402, see U.S. Pat. No. 6,249,073 B1.

Beam 402 is supported at its flexural, fundamental-mode, nodal points 401 by four torsional-mode supports 403. Theoretically, there will be no translational movement of beam 402 at nodal points 401, even when beam 402 is resonating. For further description of fundamental-mode nodal points, including how to determine their position along a beam, see, e.g., U.S. Pat. No. 6,249,073 B1.

In some other embodiments, less than four torsional-mode supports 403 are used. Exemplary of some of these other embodiments are those in which a plurality of resonators 400 are coupled together to form filters or other complex micromechanical circuits. In some of these embodiments, supports 403 on one side of resonator 400 are replaced by a bridging element that couples two resonant beams 402 together (see, e.g., FIG. 8 and the accompanying description).

The other end (distal to beam 402) of each support 403 is anchored or "clamped" to underlying ground plane/sense electrode 406 at anchors 404. In a departure from prior-art resonator 200, supports 403 of resonator 400 are not quarter-wave supports. More particularly, supports 403 have a length, $l_s$, that is advantageously substantially less than one-quarter (¼) wavelength of the resonant frequency of beam 402.

It is now appropriate to provide several explanations/definitions. In particular, for use in this specification, the term "length," when referring to the length of a support (e.g., support 403), means the distance between two "ends" of a support. In the illustrative embodiment depicted in FIG. 5, one end is at the edge of beam 402 and the other end is at anchor 404.

It is notable that the phrase "length, $l_s$, that is advantageously substantially less than one-quarter (¼) wavelength of the resonant frequency of beam" (see para. 0052) references a length (i.e., one-quarter wavelength) to a frequency (i.e., resonant frequency). But in view of the well-defined relationship between frequency and wavelength ($\lambda=1/v$, wherein $\lambda$=wavelength and v=frequency), the meaning will be clear to those skilled in the art. In particular, it is understood that this phrase means one-quarter of the wavelength that corresponds to the resonant frequency (i.e., the "resonant wavelength"). It is conventional, however, to refer to the resonant frequency, not a resonant wavelength. That convention will be adhered to in this specification.

In typical vertical-mode, free-free resonators (which will have quarter-wave supports), such as resonator 200, supports 203 and beam 202 have similar lengths. See, e.g., U.S. Pat. No. 6,249,073, Table 1 (col. 9). In contrast, in some embodiments, length, $l_s$, of support 403 of resonator 400 is less than one-half the length, $l_b$, of beam 402. In some further embodiments, length, $l_s$, of support 403 is less than one-quarter the length, $l_b$, of beam 402.

By way of further quantitative guidance, length, $l_s$, of support 403 of resonator 400 is not more than about 5 microns in some embodiments, is not more than about 2 microns in some other embodiments, and is not more than about 1 micron and yet some other embodiments.

Furthermore, in some embodiments in which length, $l_s$, of support 403 is not more than about 5 microns, the width, $w_s$, of support 403 is not more than about 2 microns and the thickness, $t_s$, of support 403 is not more than about 2 microns.

And in some embodiments in which length, $l_s$, of support 403 is not more than about 2 microns, the width, $w_s$, of support 403 is not more than about 2 microns and the thickness, $t_s$, of support 403 is not more than about 2 microns.

And in some embodiments in which length, $l_s$, of support 403 is not more than about 1 micron, the width, $w_s$, of support 403 is not more than about 2 microns and the thickness, $t_s$, of support 403 is not more than about 2 microns.

Furthermore, in some embodiments, length, $l_s$, of support 403 is equal to width, $w_s$, of support 403.

Electrode 408 is disposed beneath beam 402. Electrode 408 and beam 402 are separated by gap 410, as best seen in FIG. 6 (showing underlying substrate 612). It is to be understood that the term "beneath," used as a descriptor for the position of electrode 408, is not intended to be used in an absolute sense. In particular, if resonator 400 is "upside down," then, strictly speaking, electrode 408 is "above" beam 402. It will be understood that terms such as "beneath," "underlying," or the like, when used to describe an orientation of electrode 408 (or other structures), are not meant in an absolute sense.

Like the prior-art resonators discussed in the Background section, in the illustrative embodiment, resonator 400 accepts two electrical inputs, $v_i$ and $V_p$.

Electrical input $v_p$ is a DC-bias voltage that is applied to the electrically-conductive mechanical network (i.e., beam 402 and ground plane 406). Electrical input $v_i$ is an AC excitation signal that is applied to electrode 408. A current, $i_o$, is generated by vibration of beam 102. This current, which an output of resonator 400, is detected directly off the DC-biased ground plane/sense electrode 406. Of course, other electrical input and output arrangements can suitably be used. For example, in some variations of the illustrative embodiment, resonator 400 has more than two electrical inputs. And in some variations of the illustrative embodiment, resonator 400 has more than one electrical output.

The electrical impedance into electrode 408 is an important consideration, especially in embodiments in which resonator 400 is used as a filter or in an oscillation circuit. Design considerations pertinent to this issue, including the DC-bias voltage, $v_p$, the size of gap 410, etc., are provided in U.S. Pat. No. 6,249,073.

Resonator 400 can be fabricated using standard surface micromachining techniques, in conjunction with, for example, multi-layer (e.g., two-layer, three-layer, etc.) polysilicon processes. See, e.g., U.S. Pat. No. 6,249,073.

In some prior-art resonators, such as the resonators described U.S. Pat. No. 6,249,073, "dimples" are provided on the bottom of the resonating beam (see dimples 26). The dimples function as stand-offs as an aid in setting gap spacing and in preventing pull-in, as is likely to occur with the quarter-wave supports that are used for prior art free-free resonators. A resonator in accordance with the illustrative embodiment of the present invention, such as resonator 400, does not require "dimples" since it is far less susceptible to pull-in than prior art free-free resonators.

Resonator 400 achieves satisfactory performance in terms of quality factor, operating frequency, dynamic range, power-handling capabilities, and resistance to pull-in. Yet, for certain applications, its thermal stability is unacceptable.

Young's modulus and stress variations with temperature are believed to have the strongest impact on resonance frequency. Combined, they yield a monotonically decreasing resonance frequency-versus-temperature curve. Although many techniques exist to reduce thermal effects (e.g., temperature compensation circuitry, oven control, etc.), they consume significant amounts of power.

Figure 7:
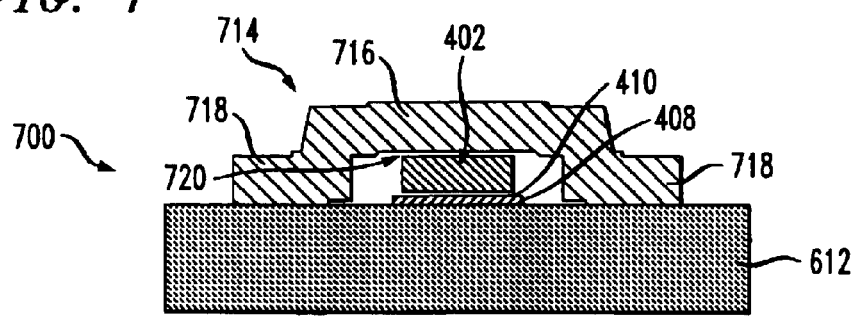
FIG. 7 depicts a cross-sectional view of a variation of the resonator of FIGS. 4–6, wherein the resonator provides temperature compensation

FIG. 7 depicts a cross-sectional view of resonator 500, which is a variation of resonator 400 that includes a structure that compensates for temperature-induced (or generally-induced) shifts in the resonance frequency of resonator 400. See, Publ. U.S. Pat. App. US 2003/0051550 A1.

The structure that compensates for induced-shifts in resonant frequency is overhanging electrode 714, which bridges beam 402. Overhanging electrode 714 comprises top electrode 716, which is supported by members 718. Top electrode is separated from beam 402 by gap 720.

Overhanging electrode 714 is formed from a material that expands faster than the material that comprises beam 402, supports 403, and anchors 404. For embodiments in which beam 402, supports 403, and anchors 404 comprise polysilicon, overhanging electrode 714 comprises, without limitation, metal. As a consequence of this selection of materials, the bottom surface of the top electrode 716 moves upward faster than the top surface of beam 402 (the movement of beam 402 is due to the thermal expansion of anchors 404, supports 403 and the thickness of beam 402). This results in a net increase in the size of gap 720. This increase in the size of gap 720 leads to a decrease in the electrical spring constant over capacitive gap 720 and a corresponding increase in the resonance frequency.

By choosing appropriate values for DC-bias voltage, $v_p$, and for the size of (initial) gap 720, the increase in resonant frequency of beam 402 can be tailored to exactly cancel the temperature-induced decrease in resonance frequency. Or, alternatively, overhanging electrode 714 is designed to provide any desired resonance-frequency response with changes in temperature.

Further disclosure concerning the design of an overhanging electrode for temperature-induced (or generally-induced) shifts in resonant frequency is provided in Publ. U.S. Pat. App. US 2003/0051550 A1. Those skilled in the art will be to apply the teachings of that disclosure to the design of resonator 500.

Figure 8:
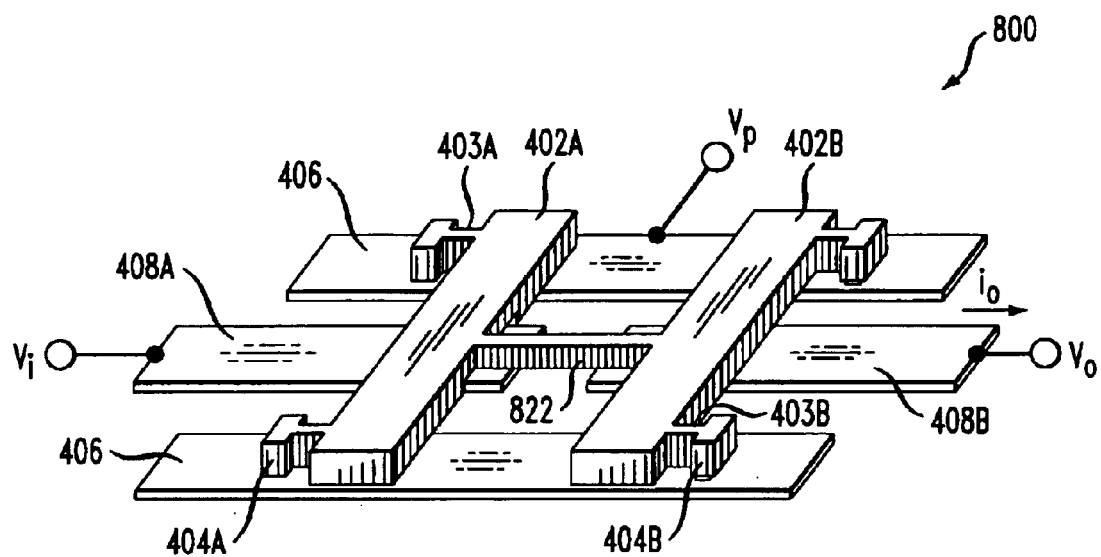
FIG. 8 depicts a filter in accordance with a variation of the illustrative embodiment of the present invention, wherein two micro-mechanical resonators are coupled.

FIG. 8 depicts filter 800 in accordance with a variation of the illustrative embodiment of the present invention, wherein two micro-mechanical resonators 400 are mechanically coupled via link 822. The two beams 402A and 402B function as capacitively-transduced micro-mechanical resonators while line 822 serves as an acoustic transmission line.

Filter 800 is excited in a manner that is similar to that described for resonator 400. In particular, a DC-bias voltage, $v_p$, is applied to the electrically-conductive mechanical network, which in this case includes beams 402A and 402B and ground plane 406. AC excitation signal, $v_i$, is applied to input electrode 408A.

Link 822, which in FIG. 8 is implemented as a beam, couples energy between resonators 402A and 402B. This results in a coupled, two-resonator system with two modes of vibration that define the passband of filter 800. The center frequency, $f_o$, of filter 800 is determined primarily by the resonance frequency of resonators 402A and 402B (for this illustrative embodiment, resonators 402A and 402B are assumed to be identical). The bandwidth of filter 800 is dictated by the relative stiffness of link 822 and resonators 402A and 402B. Note that in some embodiments, the resonators 402A and 402B are not identical and have a different resonant frequency.

It is notable that in filter 800, only two supports 403A (or 403B) and two anchors 404A (or 404B) are used per beam 402A (or 402B). In some other embodiments, a different number of supports (e.g., four, etc.) is used. Furthermore, while a single link 822 is used to couple beams 402A and 402B, in some other embodiments, two or more links are used. Also, it is to be understood that in some variations of a filter in accordance with the illustrative embodiment, the filter will have more than two resonators.

For further details concerning the design and fabrication of filters, which those skilled in the art can suitably apply to the design and implementation of filter 800, see, e.g., Bannon et al., "High Frequency Micromechanical Filters," *IEEE J. Solid-State Cir.*, v(35), n. 4, pp. 512–526 (April 2000); Nguyen et al., "Micromachined Devices for Wireless Telecommunications," *Proc. IEEE*, v.(86), no.8, pp. 1756–1768 (August 1998), and other publications referenced herein.

Figure 9:
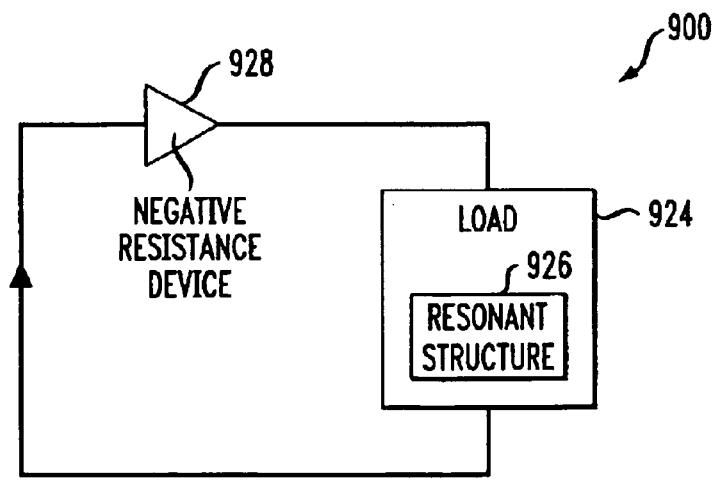
FIG. 9 depicts an oscillator in accordance with a variation of the illustrative embodiment of the present invention.

FIG. 9 depicts oscillator 900 in accordance with a variation of the illustrative embodiment of the present invention. Oscillator 800 includes load 924, which is electrically coupled to negative-resistance device 928. Load 924 incorporates resonant structure 926, which comprises one or more resonators in accordance with the illustrative embodiment (e.g., resonator 400, etc.). Oscillation frequency of oscillator 900 is determined by load 924 (e.g., the resonant frequency of resonant structure 926, etc.) and terminating circuits (not depicted).

As used herein, the phrase "negative resistance" is used to describe a process whereby energy is coupled into a resonant structure to sustain RF oscillations. In some embodiments, negative resistance device 926 is a Gunn diode or an IMPATT diode, which is biased to create a negative resistance. In another common oscillator structure, negative resistance device 926 is realized as an amplification device, such as a transresistance amplifier.

For further details concerning the design and fabrication of oscillators, which those skilled in the art can suitably apply to the design and implementation of oscillator 900, see, e.g., Nguyen et al., "Frequency-Selective MEMS for Miniaturized Low-Power Communication Device," *IEEE Trans. Microwave Theory Tech.*, v(47), no.8, pp. 1486–1503 (August 1999); Nguyen et al., "Transceiver Front-End Architectures Using Vibrating Micromechanical Signal Processors," *Dig. Of Papers, Topical Mtg on Silicon Monolithic Integrated Circuits in RF Systems*, pp. 23–32 (Sep. 12–14, 2001).

Figure 10:
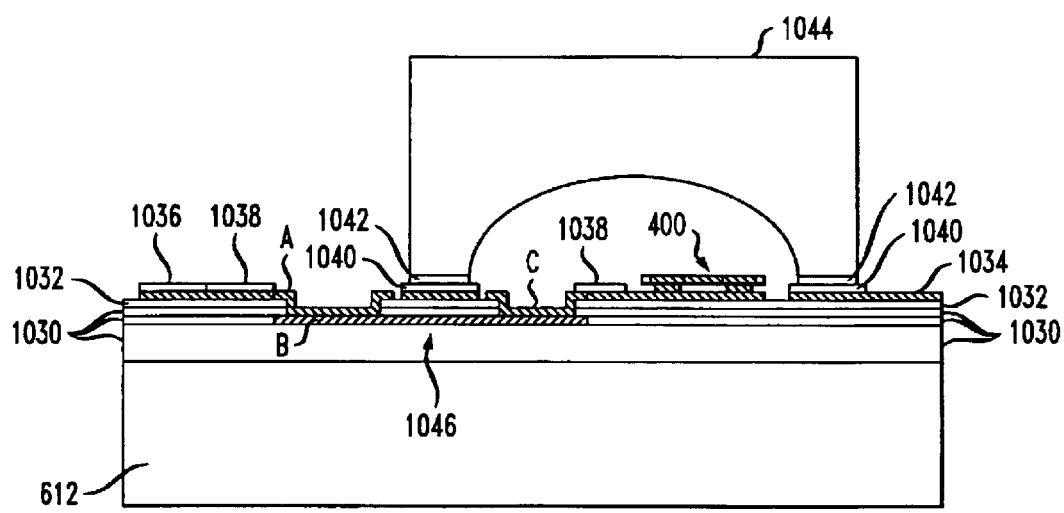
FIG. 10 depicts a first illustrative arrangement for wafer-level vacuum packaging for use in conjunction with the illustrative embodiment of the present invention.

To reduce the damping of beam 402 that would otherwise occur in air under ambient pressure conditions, the devices described in this specification (e.g., resonator 400, filter 800, etc.) will operate under vacuum in the presence of an inert gas (e.g., argon, nitrogen, etc.). FIG. 10 depicts a first illustrative arrangement for wafer-level vacuum packaging for use in conjunction with the illustrative embodiment of the present invention.

In FIG. 10, various materials layers are disposed on substrate 612. Layers 1030 are oxide layers, layer 1032 is a nitride layer, and "cross-hatched" layers 1034 comprise polysilicon. Additionally, bond pad 1036, signal lines 1038, and bond pads 1040 and 1042 comprise gold. Cap 1044 provides the hermetic seal for resonator 400. Cap 1044 can be formed of any of a variety of suitable materials, including, without limitation, glass, quartz, or silicon. Thermocompression bonding, well known in the art, is used to attach cap 1044 to the wafer. The thermocompression bond occurs at gold layers 1040 and 1042.

An important packaging consideration is how to electrically couple hermetically-sealed resonator 400 with circuits/devices that are outside of the hermetic seal. In the embodiment depicted in FIG. 10, electrical contact is formed by an "embedded interconnection," shown generally at 1046. The embedded electrical interconnection is created by polysilicon traces A, B, and C. Trace B, which is formed from the "Poly0" layer of the fabrication process, bridges the gap between trace C (which is formed from the "Poly1" layer and is disposed within the hermetic seal) and trace A (which is formed from the "Poly1" layer and is disposed outside of the hermetic seal).

FIGS. 11A–11B, 12A–12B, and 13 depict a second illustrative arrangement for wafer-level vacuum packaging for use in conjunction with the illustrative embodiment of the present invention.

Figure 11A:
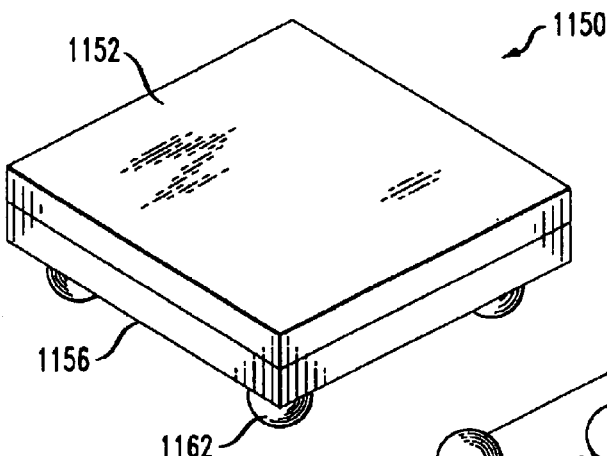
FIG. 11A depicts a top perspective view of a second illustrative arrangement for wafer-level vacuum packaging for use in conjunction with the illustrative embodiment of the present invention.
Figure 11B:
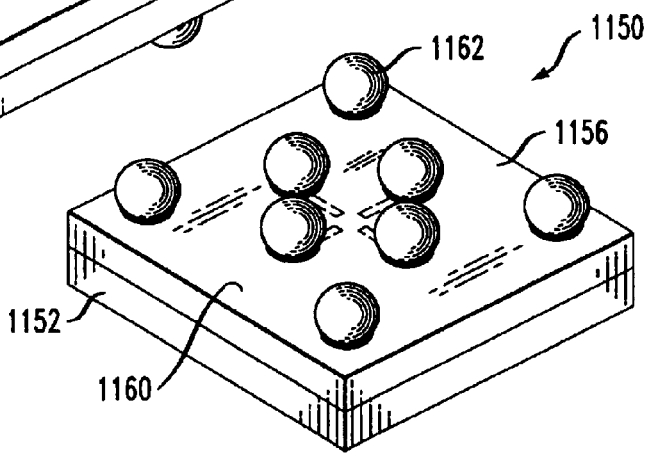
FIG. 11B depicts a bottom perspective view of the second illustrative arrangement for wafer-level vacuum packaging of FIG. 11A.

FIGS. 11A and 11B depict perspective views of package 1150; FIG. 11A depicts a top perspective view and FIG. 11B depicts a bottom perspective view. As shown in those Figures, package 1150 includes cap 1152 and substrate 1156. Resonator 400 is obscured in FIGS. 11A and 11B; it resides on "top" surface 1258 (see, FIG. 12A) of substrate 1156 within a cavity that is formed by features of cap 1152, as described below. "Solder" balls 1162 are disposed on "bottom" surface 1160 of substrate 1156 and provide physical and electrical contact to higher-level packaging (not depicted). In some embodiments, cap 1152 is glass and substrate 1154 is silicon.

Figure 12A:
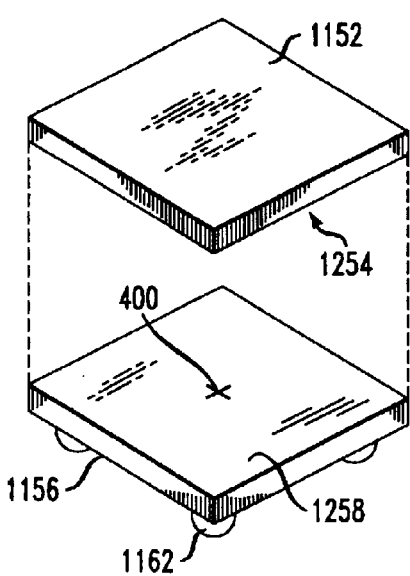
FIG. 12A depicts an exploded view of the second illustrative arrangement for wafer-level vacuum packaging of FIG. 11A.
Figure 12B:
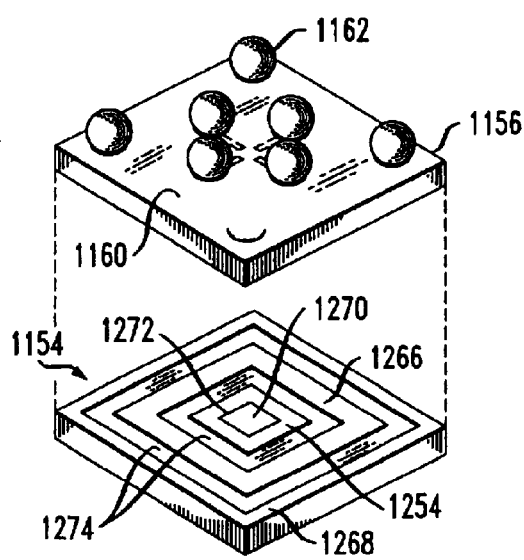
FIG. 12B depicts an exploded view of the second illustrative arrangement for wafer-level vacuum packaging of FIG. 11B.

FIGS. 12A and 12B provide "exploded" views of package 1150, wherein FIG. 12A provides the same perspective as FIG. 11A, and FIG. 12B provides the same perspective as FIG. 11B. Resonator 400 is visible in FIG. 12A.

Disposed on bottom surface 1154 of cap 1152 are a series of concentric squares, identified as inner wall 1264, middle wall 1266, and outer wall 1268. When bottom surface 1254 of cap 1152 is abutted to top surface 1258 of substrate 1156, inner wall 1264 seals against top surface 1258 to form a cavity (see, FIG. 13, cavity 1376). Resonator 400 resides within the cavity. In some embodiments, inner wall 1264 and outer wall 1268 comprise a metal.

Inner wall 1264 defines region 1270. Getter 1272 is disposed in region 1270. The getter absorbs gas and moisture. This helps to maintain vacuum in cavity 1376 and prevent condensation on resonator 400. Getter 1272 can be a single-layer or multi-layer thin film, zirconium-based material, or any other appropriate material, as is commercially available from NanoGetters (Ypsilanti, Mich.), SAES Getters (Viale, Italy) and others.

Middle wall 1266, which is disposed in sealing moat 1274 that is formed between inner wall 1264 and outer wall 1268, comprises a bonding material. The bonding material, which can be, without limitation, a glass frit, solder, etc., is used to bond or other otherwise attach cap 1152 to substrate 1156. The bonding material is typically heated to effect bonding. Sealing moat 1274 retains any flow that results from heating the bonding material.

Figure 13:
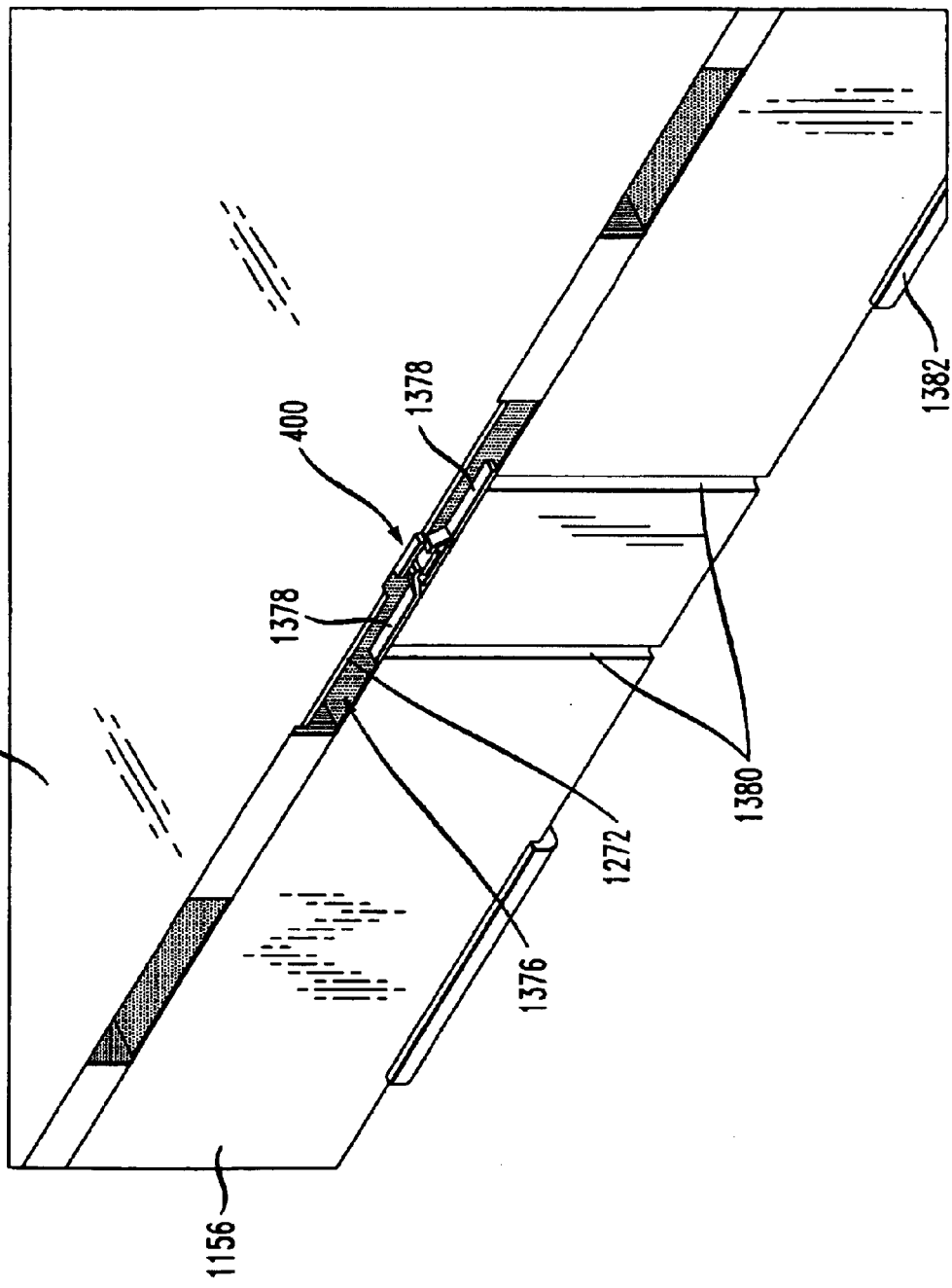
FIG. 13 depicts a cross sectional view of the second illustrative arrangement for wafer-level vacuum packaging of FIGS. 11A–B and 12A–B.

FIG. 13 depicts a cross-section of package 1150. Some of the features that were previously described that are visible in FIG. 13 include substrate 1156, cap 1152, inner wall 1264, middle wall 1266, resonator 400, getter 1272, and cavity 1376.

Additional structures that are depicted in FIG. 13, including front-side contacts 1378, vias 1380, and backside contacts 1382, are used to electrically couple hermetically-sealed resonator 400 with circuits/devices that are outside of the hermetic seal. In some embodiments, there are four vias 1380: the two that are depicted in FIG. 13, a third that electrically couples to drive electrode 408A, and a fourth that electrically couples to sense electrode 408B (the latter two do not appear in the cross-sectional view depicted in FIG. 13). Vias 1380 electrically couple to backside contacts 1382, which are themselves electrically coupled to solder balls 1162.

The dimensions of package 1150 can vary as required. In one embodiment, package 1150 has the following dimensions:

| | |
|---|---|
| Cavity 1376: | 300 microns ($\mu$m) × 300 $\mu$m |
| Thickness of inner wall 1264: | 150 microns $\mu$m |
| Height of inner wall 1264: | 15 microns $\mu$m |
| Width of sealing moat 1274: | 500 microns $\mu$m |
| Thickness of outer wall 1268: | 80 microns $\mu$m |
| Height of outer wall 1268: | 15 microns $\mu$m |
| Substrate 1156: | 1.8 millimeters (mm) × 1.8 mm |
| Cap 1152: | 1.8 mm × 1.8 mm × .75 mm |
| Diameter of solder balls 1162: | 0.3 mm |

In a second embodiment of package 1150, the height of inner wall 1264 and outer wall 1268 is 30 microns (other dimensions are the same as in the first embodiment).

In some embodiments, a post-fabrication annealing operation is conducted. The annealing operation is used, for example, to trim the resonant frequency and/or enhance the quality factor of a resonator and associated micro-mechanical structures. The annealing operation involves passing a current through the micro-mechanical microstructures of interest (e.g., resonator, etc.), thereby heating them. The structures are heated to temperatures that are sufficiently high to change certain micro-structural or materials properties, which results in changes in the resonant frequency and quality factor. See, e.g., U.S. Pat. Nos. 5,976,994 and 6,169,321.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

I claim:

1. An apparatus comprising a first resonator, wherein said first resonator comprises:
   a resonating element, wherein said resonating element has a resonant frequency and nodal points;
   a first electrode, wherein said first electrode underlies said resonating element and is separated from said resonating element by a first gap;
   at least one support, wherein:
      said support has a first end and a second end;
      said first end of said support and said resonating element are joined at one of said nodal points; and
      said support has a length that is less than one-quarter wavelength of said resonant frequency.

2. The apparatus of claim 1 wherein said length of said support is not more than 2 microns.

3. The apparatus of claim 2 wherein a width of said support is not more than 2 microns and a thickness of said support is not more than 2 microns.

4. The apparatus of claim 1 wherein said first electrode is electrically connected to a source of an excitation voltage and wherein said resonating element is electrically connected to a source of a bias signal.

5. The apparatus of claim 4 wherein said apparatus is a filter.

6. The apparatus of claim 1 wherein said resonating element is a beam.

7. The apparatus of claim 1 comprising four supports, wherein each of said supports and said resonating element are joined at a respective one of said nodal points.

8. The apparatus of claim 1 comprising an anchor that is attached to a ground plane, wherein said second end of said support and said anchor are joined.

9. The apparatus of claim 1 wherein said length of said support is less than one-half of a length of said resonating element.

10. The apparatus of claim 1 wherein said length of said support is less than one-quarter of a length of said resonating element.

11. The apparatus of claim 1 wherein said length of said support is not more than 5 microns.

12. The apparatus of claim 1 wherein said length of said support is not more than 1 micron.

13. The apparatus of claim 1 wherein said length of said support is equal to a width of said support.

14. The apparatus of claim 1 wherein said first gap has a minimum size when a bias voltage is applied, and wherein said minimum size is determined by an amplitude of said bias voltage.

15. The apparatus of claim 1 wherein said resonating element comprises a material selected from the group consisting of silicon, diamond and metals.

16. The apparatus of claim 1 comprising a second resonator, wherein said second resonator has a second resonating element, and wherein said second resonating element has a second resonant frequency and is mechanically coupled to said resonating element.

17. The apparatus of claim 1 wherein said apparatus is an oscillator.

18. The apparatus of claim 1 further comprising a second electrode, wherein said second electrode overlies said resonating element and is separated from said resonating element by a second gap.

19. An apparatus comprising:
   a resonating element, wherein said resonating element has:
      a resonant frequency;
      a first end and a second end;
      a first nodal point proximal to said first end; and
      a second nodal point proximal to said second end;
   an electrode, wherein said electrode underlies said resonating element between said first nodal point and said second nodal point, and further wherein said electrode is separated from said resonating element by a gap;
   a first support, wherein:
      said first support has a first end and a second end; and
      said first end of said first support and said resonating element are joined at said first nodal point;
   a second support, wherein:
      said second support has a first end and a second end; and
      said first end of said second support and said resonating element are joined at said second nodal point;
   and wherein said first support and said second support each have a length that is less than one-eighth wavelength of said resonant frequency.

20. An apparatus comprising:
   resonating means, wherein said resonating means is characterized by a resonant frequency and flexural nodal points;
   support means for supporting said resonating means, wherein said support means is coupled to said resonating means proximal to at least one of said flexural nodal points, wherein said support means has a length that is less than one quarter of said resonant frequency.

21. An apparatus comprising a resonator, wherein said resonator comprises:
   a resonating element having flexural nodal points; and
   at least two supports, wherein said two supports and said resonating element are mechanically coupled proximal to two of said flexural nodal points, and wherein said two supports each have a length that is less than one-quarter wavelength of said resonant frequency.

22. An apparatus comprising a resonator, wherein said first resonator comprises:
   a resonating element, wherein said resonating element is characterized by a resonant frequency, and has a first end and a second end;
   an electrode, wherein said electrode underlies said resonating element, wherein said electrode is separated from said resonating element by a gap;
   a first support, wherein:
      said first support has a first end and a second end; and
      said first end of said first support and said resonating element are joined proximal to said first end of said resonating element;
   a second support, wherein:
      said second support has a first end and a second end; and
      said first end of said second support and said resonating element are joined proximal to said second end of said resonating element;
   and wherein said first support and said second support each have a length that is less than one-eighth wavelength of said resonant frequency.

* * * * *